United States Patent [19]
Sato

[11] 3,970,881
[45] July 20, 1976

[54] RECTIFIER ASSEMBLY
[75] Inventor: Suguru Sato, Ohbu, Japan
[73] Assignee: Nippondenso Co., Ltd., Kariya, Japan
[22] Filed: Mar. 10, 1975
[21] Appl. No.: 556,954

[30] Foreign Application Priority Data
- Mar. 12, 1974 Japan.............................. 49-28871
- Oct. 24, 1974 Japan............................ 49-129214
- Oct. 28, 1974 Japan............................ 49-130788

[52] U.S. Cl. ................................ 310/68 D; 310/71
[51] Int. Cl.² ....................................... H02K 11/00
[58] Field of Search ............. 310/68, 68 D, 168, 71

[56] References Cited
UNITED STATES PATENTS
3,548,226  12/1970  Sato ..................................... 310/68
3,895,247  7/1975  Iwata et al. ....................... 310/68 D Primary Examiner—Donovan F. Duggan
Attorney, Agent, or Firm—Cushman, Darby & Cushman

[57] ABSTRACT

A rectifier assembly is installed in an alternating current generator for providing D.C. current. The rectifier assembly includes a positive and negative cooling fin on which positive and negative diodes are respectively fixed, and interconnecting leads for respectively connecting each of the positive diodes with each of the negative diodes, wherein at least one of the interconnecting leads is disposed in slots of the stator core of the generator, whereby the interconnecting leads become resistant to line-failure or the like due to violent vibration.

4 Claims, 7 Drawing Figures

RECTIFIER ASSEMBLY

BACKGROUND OF THE INVENTION

1. Field of the Invention

The present invention relates to a rectifier assembly and more particularly to a rectifier assembly to be combined with a three-phase automative type alternator, so as to form a complete alternator rectifier combination therewith.

2. Description of the Prior Art

In a conventional rectifier assembly of this kind, for example as exemplified in U.S. Pat. No. 3,641,374, the rectifier assembly is integrally mounted in an alternator construction, in which connecting lines between diodes are provided by a printed circuit embedded in cooling fins or heat sinks therefor.

Such an assembly is, however, disadvantageous in that a base plate of the printed circuit must be made of an expensive heat-resisting material such as epoxy resin since the rectifier assembly is exposed to various temperature conditions, or because a much stabler connection is required in the connection between the base plate and the printed circuit since it is exposed to a violent vibrating condition.

In another conventional rectifier assembly as exemplified in U.S. Pat. No. 3,527,972, six diodes, which form a full-wave bridge rectifier, are mounted on cooling strips and connecting lines between diodes are wired.

However, the assembling steps of these connecting lines are very troublesome and line failures may result due to violent vibration.

SUMMARY OF THE INVENTION

It is, therefore, a primary object of the present invention to overcome the above drawbacks and to provide an improved rectifier assembly for an alternator.

It is another object of the present invention to provide a rectifier assembly for the alternator, in which connecting lines between diodes are disposed in slots of a stator core of the alternator.

It is a further object of the present invention to provide a rectifying device which is of low-cost, resistant to vibration and easy to manufacture.

Other objects and advantages will be apparent from the following description in connection with drawings.

DETAILED DESCRIPTION OF THE PREFERRED EMBODIMENTS

Figure 1:
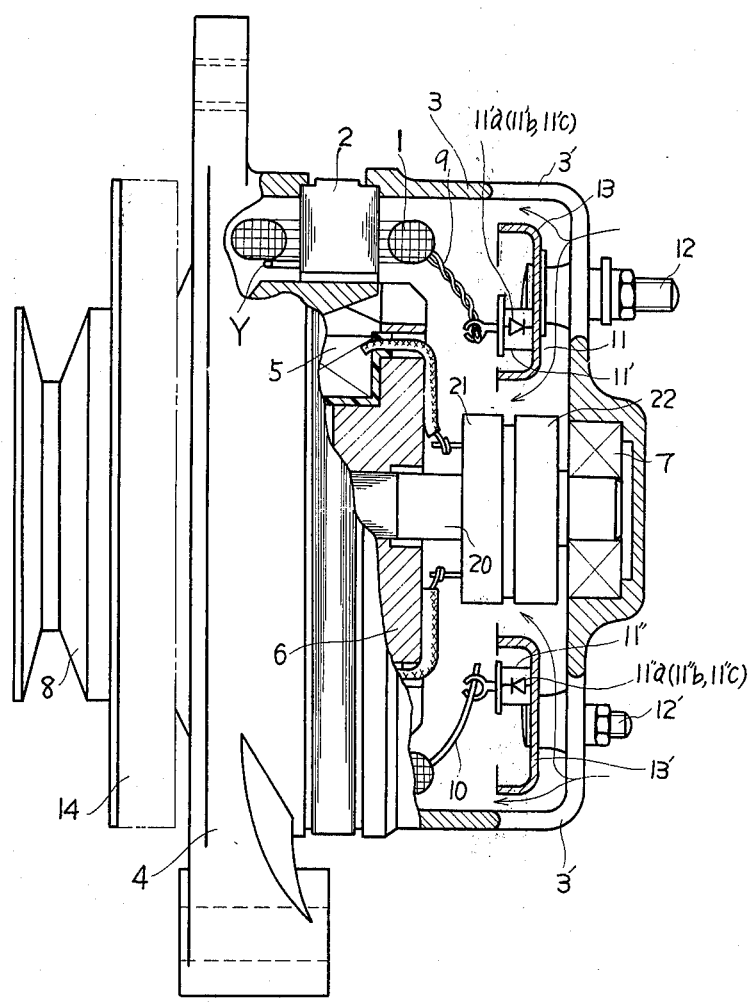
FIG. 1 is a partial cross sectional view of an alternating current generator in which a rectifier assembly according to the present invention is embedded.

Now referring to FIG. 1, end brackets 3 and 4 rotatably support a shaft 20 by means of bearings 7 mounted therein. The shaft 20 is driven by means of a pulley 8 secured thereto, for example, by an internal combustion engine. A pair of slip rings 21 and 22 provide electrical current to a field winding 5 secured to the shaft 20. A pair of bushes 23 and 24 (in FIG. 4) secured in a brush holder 25 (in FIG. 4), and connected with field terminals 26 and 27 (in FIG. 4) supply electrical current to the field winding 5. The end brackets 3 and 4 also support a stator core 2 on which a Y-connected output winding 1 is wound.

The end bracket 3 supports a rectifier assembly 11 including cooling fins 13 and 13' to rectify the three-phase output current fed from the output winding 1. Output terminals 12 and 12' are respectively connected to the cooling fins 13 and 13' to supply electric power to loads (not shown).

A cooling fin 14 is secured to the shaft 20 and is driven thereby, whereby the cooling fins 13 and 13' can be cooled by air flow, designated by a letter "a" through a window 3' provided on the end bracket 3.

Figure 2:
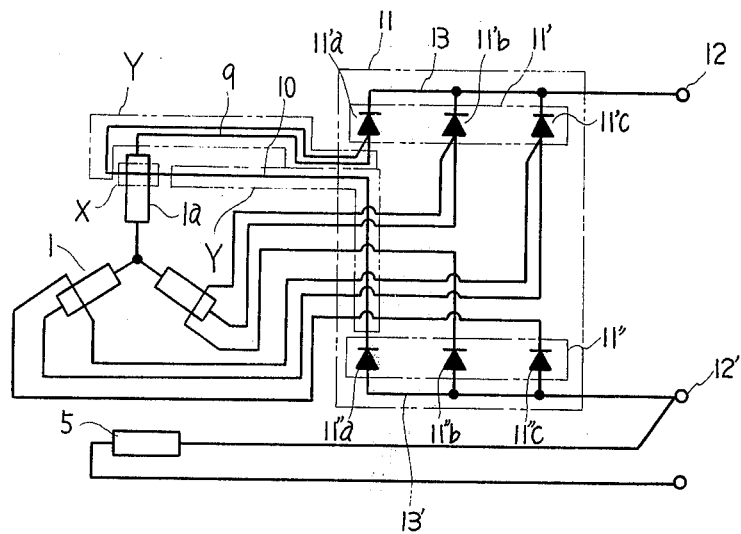
FIG. 2 is a circuit diagram showing connection between an output winding of the generator and diodes of the rectifier assembly.
Figure 3:
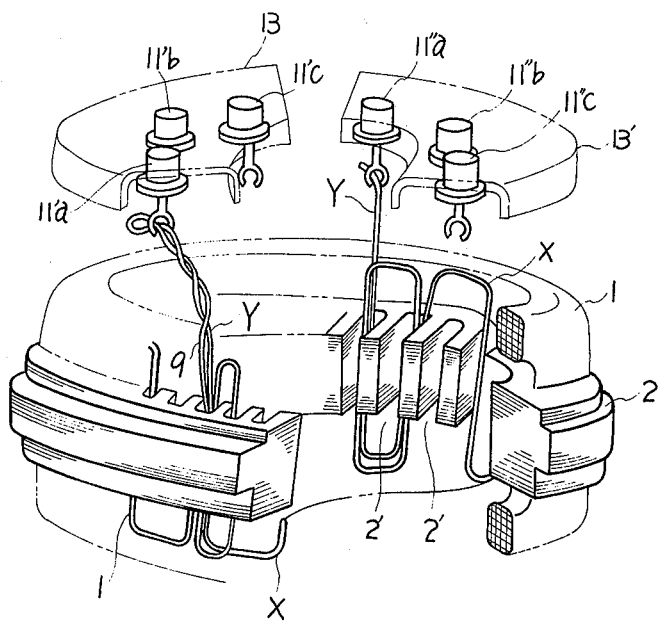
FIG. 3 is a perspective segmentary view showing the rectifier assembly and the stator of the generator.

The rectifier assembly 11 includes positive rectifying elements 11'a, 11'b and 11'c and negative rectifying elements 11''a, 11''b and 11''c which act as a full-wave bridge rectifier (the detailed circuit diagram thereof being shown in FIG. 2). The positive and negative rectifying elements are respectively secured to the cooling fins 13 and 13' as shown in FIG. 3 and a connecting line 10 between the positive and negative rectifying elements 11'a and 11''a is disposed in slots 2' of the stator core 2. Each end 9 of the output winding 1 is connected to each positive rectifying element. The other connecting lines between the positive and negative rectifying elements are not shown in FIG. 3 but also are disposed in the slots as in the same manner as the connecting line 10.

The part, designated by X, of the connecting line 10 disposed in the slots 2' is automatically fixed to the slots by an insulating treatment such as an insulating coating for the output winding 1. Each other part, designated by Y, of the connecting line 10 between a rectifying element and the slot is taken out from the nearest slot to the rectifying element so that the exposed length of the part Y may be as short as possible.

Therefore, the rectifier assembly becomes resistant to line failure and the assemblying step becomes easier since most of the connecting line can be wired in the automatic wiring step of the output winding.

Figure 4:
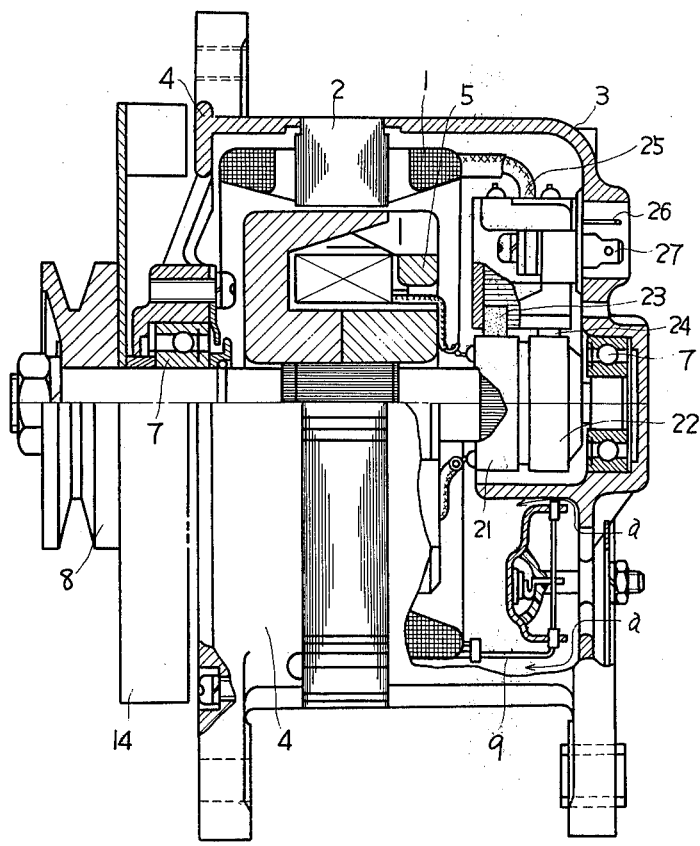
FIG. 4 is a partial cross sectional view of a modified embodiment.
Figure 5:
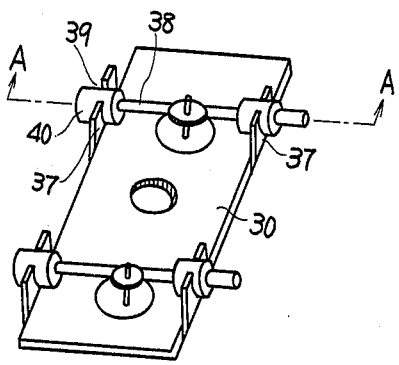
FIG. 5 is a perspective view of a rectifier assembly.
Figure 6:
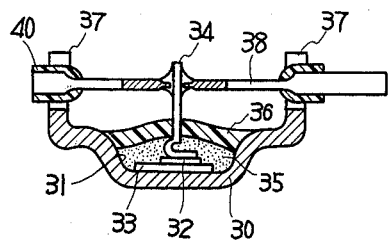
FIG. 6 is a cross sectional view taken along a line A—A in FIG. 5.

FIG. 4 shows a modified embodiment according to the present invention which differs from the first embodiment in FIG. 1 with respect to the construction of the rectifying element which is described hereinafter in detail with reference to FIGS. 5 and 6. In FIGS. 5 and 6, a rectifier element 32 is soldered at one polar surface to a copper washer 33 disposed in, and electrically connected with, a concave portion 31 of a cooling fin 30. The copper washer 33 serves to decrease the heat-resistance of the rectifier element 32. An upper lead 34 is soldered to the other polar surface of the rectifier element 32. Thereafter, the rectifier element 32 is covered with gelled-silicon 35 and additional silicon rubber 36 is coated thereon for protecting the rectifier element from physical and external force, corrosion, soil or the like. A numeral 37 designates a bent portion of fin 30 provided with a U-shaped groove 39. A conductor 38 is supported by the bent portion 37 through an insulating bushing 40 which is fixedly inserted into the U-shaped groove 39. The conductor 38 is electrically connected to the upper lead 34 at a certain distance from the cooling fin 30 to ensure manufacturing efficiency and protection from electrolytic corrosion.

Figure 7:
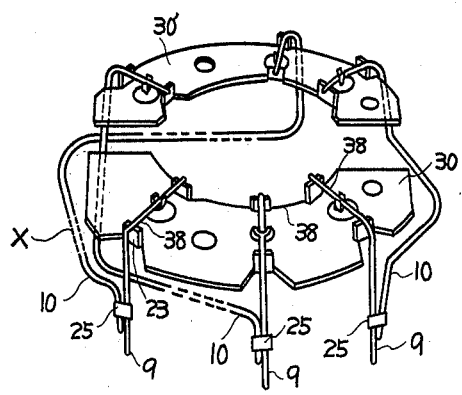
FIG. 7 is a perspective view of a rectifier assembly to be embedded in the generator shown in FIG. 4.

In FIG. 7, a perspective view of a rectifier assembly which is installed in the alternator shown in FIG. 4 is illustrated. It is apparent from this figure that each end 9 of the output winding 1 is respectively connected to the conductor 38 to which the rectifier element serving as, for example, the positive rectifying element 11a shown in FIG. 2 is also connected. Each connecting line 10 between the positive and the negative rectifying elements is respectively connected to the conductor 38 and the part of line 10 designated by X is disposed in the slots 2' of the stator core 2 in the same manner described in the first embodiment shown in FIG. 1.

What I claim is:

1. A rectifier assembly, combined with an alternating current generator having a field winding and a polyphase output winding, comprising;
   a plurality of pairs of positive and negative diodes;
   a positive and a negative cooling fin respectively providing a positive and a negative output terminal;
   each of said positive diodes being mounted on said positive cooling fin at its cathode side;
   each of said negative diodes being mounted on said negative cooling fin at its anode side;
   said polyphase output winding being wound on a stator core of said alternating current generator;
   a plurality of leads each respectively interconnecting an anode side of a positive diode with a cathode side of a negative diode;
   means connecting said polyphase output winding to said interconnecting leads; and
   at least one of said interconnecting leads being disposed in slots within said stator core.

2. An alternating current generator comprising;
   a field winding;
   stator core, including a plurality of slots, on which core a polyphase output winding is wound; and
   a rectifier assembly connected with said polyphase output winding for rectifying the output thereof, said rectifier assembly comprising;
   a positive and a negative cooling fin providing output terminals;
   a plurality of groups of positive and negative diodes respectively mounted on said positive and negative cooling fin; and
   leads for interconnecting each anode of said positive diodes with each cathode of said negative diodes,
   at least one of said interconnecting leads being disposed within said slots.

3. A rectifier device comprising;
   a cooling fin having a concave portion and acting as a direct current output terminal;
   a semi-conductor rectifying element positioned in and soldered to the concave portion of said cooling fin at one electrode;
   an upper lead soldered at the other electrode of said semi-conductor rectifying element;
   a heat-resisting insulating material filled in said concave portion to cover said semi-conductor rectifying element;
   a pair of bent portions provided at both ends of said cooling fin;
   a conductor fixed across said pair of bent portions and insulated from said cooling fin by means of insulating bushes for acting as an alternating current input terminal; and
   means electrically fixing said upper lead to said conductor.

4. In an alternating current generator comprising;
   a field winding;
   a stator core including a plurality of slots in which a polyphase output winding is wound; and
   a rectifier assembly located in the interior of the housing of said generator for rectifying the output of said polyphase output winding, said rectifier assembly comprising;
   a positive and negative cooling fin respectively having a plurality of concave portions acting as direct current output terminal;
   a plurality of positive semi-conductor rectifying elements soldered at their cathode electrodes to the concave portions of said positive cooling fin;
   a plurality of negative semi-conductor rectifying elements soldered at their anode electrodes to the concave portions of said negative cooling fin;
   first upper leads soldered at respective anode electrodes of said positive semi-conductor rectifying elements;
   second upper leads soldered at respective cathode electrodes of said negative semi-conductor rectifying elements;
   heat-resisting insulating material filled in the concave portions of said positive and negative cooling fin to cover said positive and negative semi-conductor rectifying elements;
   first and second bent portions provided at ends of said positive and negative cooling fin;
   first and second conductors respectively fixed across said first and second bent portions, insulated from said positive and negative cooling fin and for acting respectively as an A.C. input terminal;
   means electrically connecting each of said first and second upper leads to each of said first and second conductors;
   a plurality of interconnecting leads for interconnecting each anode electrode of said positive semi-conductor rectifying elements with each cathode electrode of said negative semi-conductor rectifying elements, at least one of said interconnecting leads being disposed in said slots; and
   means electrically connecting each end of said polyphase output winding with each of said interconnecting leads.

* * * * *